(12) United States Patent
Hon et al.

(10) Patent No.: US 9,306,123 B2
(45) Date of Patent: *Apr. 5, 2016

(54) LIGHT-EMITTING ELEMENT

(71) Applicant: EPISTAR CORPORATION, Hsinchu (TW)

(72) Inventors: Schang-Jing Hon, Hsinchu (TW); Chao-Hsing Chen, Hsinchu (TW); Tsun-Kai Ko, Hsinchu (TW); Chien-Fu Shen, Hsinchu (TW); Jia-Kuen Wang, Hsinchu (TW); Hung-Che Chen, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/827,872

(22) Filed: Aug. 17, 2015

(65) Prior Publication Data

US 2015/0357524 A1      Dec. 10, 2015

Related U.S. Application Data

(63) Continuation of application No. 14/718,242, filed on May 21, 2015, now Pat. No. 9,153,738, which is a continuation of application No. 14/098,911, filed on Dec. 6, 2013, now Pat. No. 9,076,946.

(30) Foreign Application Priority Data

Dec. 7, 2012   (TW) .............................. 101146339 A

(51) Int. Cl.
*H01L 33/00*   (2010.01)
*H01L 33/38*   (2010.01)
*H01L 33/54*   (2010.01)
*H01L 33/62*   (2010.01)
*H01L 33/46*   (2010.01)
*H01L 33/44*   (2010.01)
(Continued)

(52) U.S. Cl.
CPC .............. *H01L 33/387* (2013.01); *H01L 33/44* (2013.01); *H01L 33/46* (2013.01); *H01L 33/54* (2013.01); *H01L 33/62* (2013.01)

(58) Field of Classification Search
CPC ......... H01L 33/44; H01L 33/46; H01L 33/62; H01L 33/20
USPC .......................................................... 257/98
See application file for complete search history.

(56) References Cited

U.S. PATENT DOCUMENTS 9,076,946 B2 * 7/2015 Hon ........................ H01L 33/44
2011/0062457 A1   3/2011 Naito et al.
(Continued)

*Primary Examiner* — Trung Q Dang
(74) *Attorney, Agent, or Firm* — Muncy, Geissler, Olds & Lowe, P.C.

(57) ABSTRACT

A light-emitting element comprises a light-emitting semiconductor stack comprising a first semiconductor layer, a second semiconductor layer on the first semiconductor layer, and a light-emitting layer between the first semiconductor layer and the second semiconductor layer; a first electrode comprising an contact area and an extension electrically connected to the first semiconductor layer, wherein the extension is connected to the contact area; a second electrode on the second semiconductor layer; and a first conductive part and a second conductive part formed on the light-emitting semiconductor stack and respectively electrically connected to the first electrode and the second electrode, wherein the extension is formed beyond a projected area of the second conductive part and not covered by the first conductive part, and the contact area is covered by the first conductive part.

20 Claims, 10 Drawing Sheets

(56) References Cited

U.S. PATENT DOCUMENTS

| | | |
|---|---|---|
| 2011/0297997 A1 | 12/2011 | Izuka et al. |
| 2013/0234192 A1 | 9/2013 | Kim et al. |
| 2013/0248910 A1 | 9/2013 | Kimura et al. |
| 2014/0048825 A1 | 2/2014 | Hsieh et al. |
| 2015/0255676 A1* | 9/2015 | Hon .................. H01L 33/44 257/98 |

* cited by examiner

LIGHT-EMITTING ELEMENT

REFERENCE TO RELATED APPLICATION

This application is a continuation application of U.S. patent application Ser. No. 14/718,242, filed on May 21, 2015, now pending, which is a continuation application of U.S. patent application Ser. No. 14/098,911, filed on Dec. 6, 2013, now pending, which claims the right of priority based on TW application Serial No. 101146339, filed on Dec. 7, 2012, and the contents of which are hereby incorporated by references in their entireties.

TECHNICAL FIELD

The present application relates to a light-emitting element, and particularly to a light-emitting element such as a flip-chip light-emitting diode, which comprises a conductive contact layer.

DESCRIPTION OF BACKGROUND ART

Optoelectronic devices, such as light-emitting diodes, are now widely used for optical display devices, traffic lights, data storage devices, communication devices, lighting devices, and medical devices.

Besides, the light-emitting diode as mentioned above is able to combine with other structures to form a light-emitting device. FIG. 6 schematically shows a conventional light-emitting device. As shown in FIG. 6, a conventional light-emitting device 5 comprises a submount 52 comprising an electrical circuit 54; a solder 56 on the submount 52, wherein the solder is used for stabilizing an LED 51 on the submount 52 and thus renders the LED 51 electrically connected to the electrical circuit 54 of the submount 52, wherein the LED 51 comprises a substrate 53; and an electrical connecting structure 58 used for electrically connecting an electrode 55 of the LED 51 to the electrical circuit 54 of the submount 52; wherein the submount 52 is a lead frame or a large-scale mounting substrate.

SUMMARY OF THE DISCLOSURE

A light-emitting element, comprising: a substrate; a light-emitting semiconductor stack on the substrate, a first protection layer on the light-emitting semiconductor stack; a reflective layer on the first protection layer; a barrier layer on the reflective layer; a second protection layer on the barrier layer; and a conductive contact layer on the second protection layer; wherein the conductive contact layer comprises a first conductive part and a second conductive part, and a surface area of an upper surface of the first conductive part is different from a surface area of an upper surface of the second conductive part.

A light-emitting element, comprising: a substrate; a light-emitting semiconductor stack on the substrate, a first protection layer on the light-emitting semiconductor stack; a reflective layer on the first protection layer; a barrier layer on the reflective layer; a second protection layer on the barrier layer; and a conductive contact layer on the second protection layer; wherein the conductive contact layer comprises a first conductive part and a second conductive part, and a surface area of an upper surface of the first conductive part is equal to a surface area of an upper surface of the second conductive part.

A light-emitting element comprises a light-emitting semiconductor stack comprising a first semiconductor layer, a second semiconductor layer on the first semiconductor layer, and a light-emitting layer between the first semiconductor layer and the second semiconductor layer; a plurality of extensions formed on the first semiconductor layer; and a first conductive part and a second conductive part formed on the light-emitting semiconductor stack and respectively electrically connected to the first semiconductor layer and the second semiconductor layer, wherein one of the plurality of extensions is formed beyond a projected area of the second conductive part and not covered by the first conductive part.

A light-emitting element comprises a light-emitting semiconductor stack comprising a first semiconductor layer, a second semiconductor layer on the first semiconductor layer, and a light-emitting layer between the first semiconductor layer and the second semiconductor layer; a first electrode comprising an contact area and an extension electrically connected to the first semiconductor layer, wherein the extension is connected to the contact area; a second electrode on the second semiconductor layer; and a first conductive part and a second conductive part formed on the light-emitting semiconductor stack and respectively electrically connected to the first electrode and the second electrode, wherein the extension is formed beyond a projected area of the second conductive part and not covered by the first conductive part, and the contact area is covered by the first conductive part.

DETAILED DESCRIPTION OF PREFERRED EMBODIMENTS

Figure 1A:
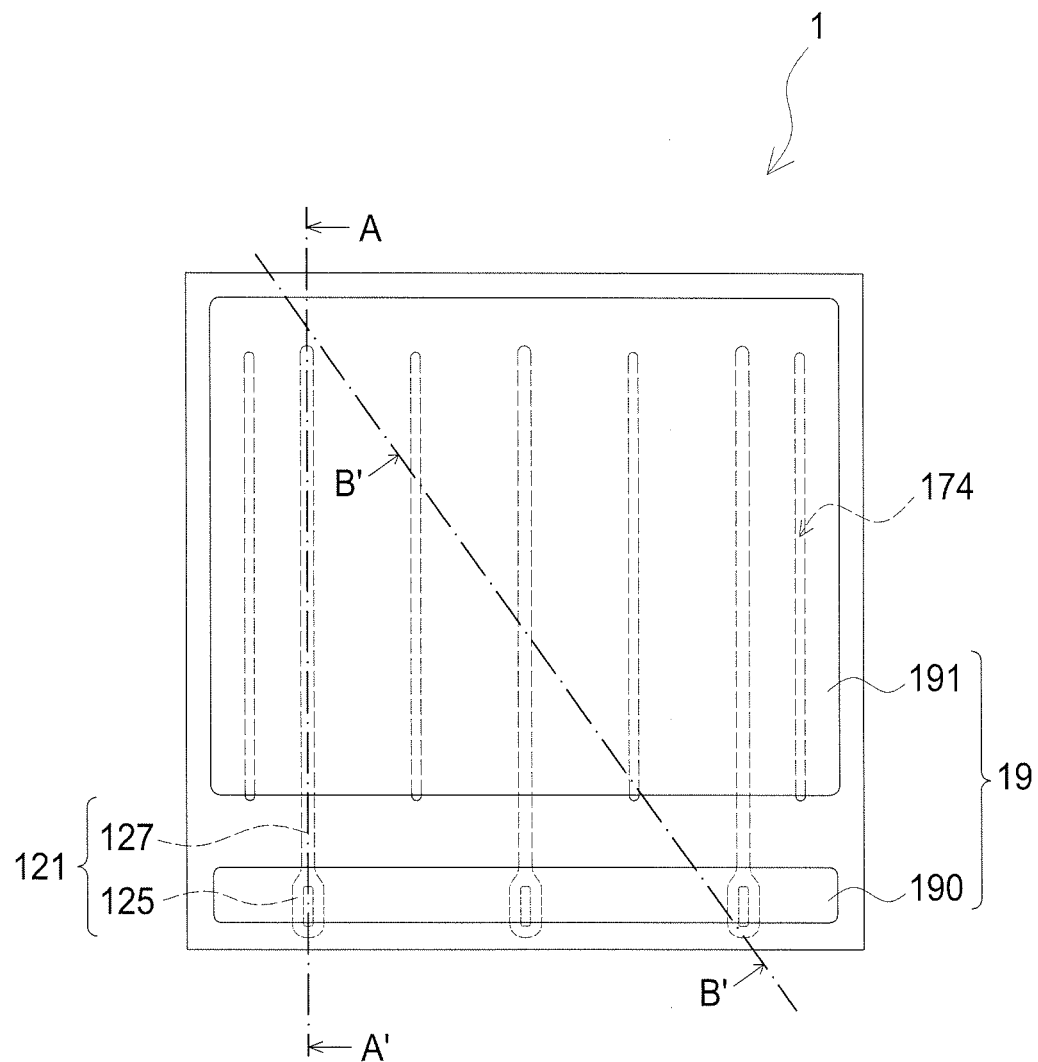
FIG. 1A is a top view of a light-emitting element in accordance with one of the embodiments of the present application.

Exemplary embodiments of the present application will be described in detail with reference to the accompanying drawings hereafter. The following embodiments are given by way of illustration to help those skilled in the art fully understand the spirit of the present application. Hence, it should be noted that the present application is not limited to the embodiments herein and can be realized by various forms. Further, the drawings are not precise scale and components may be exaggerated in view of width, height, length, etc. Herein, the similar or identical reference numerals will denote the similar or identical components throughout the drawings.

Figure 1B:
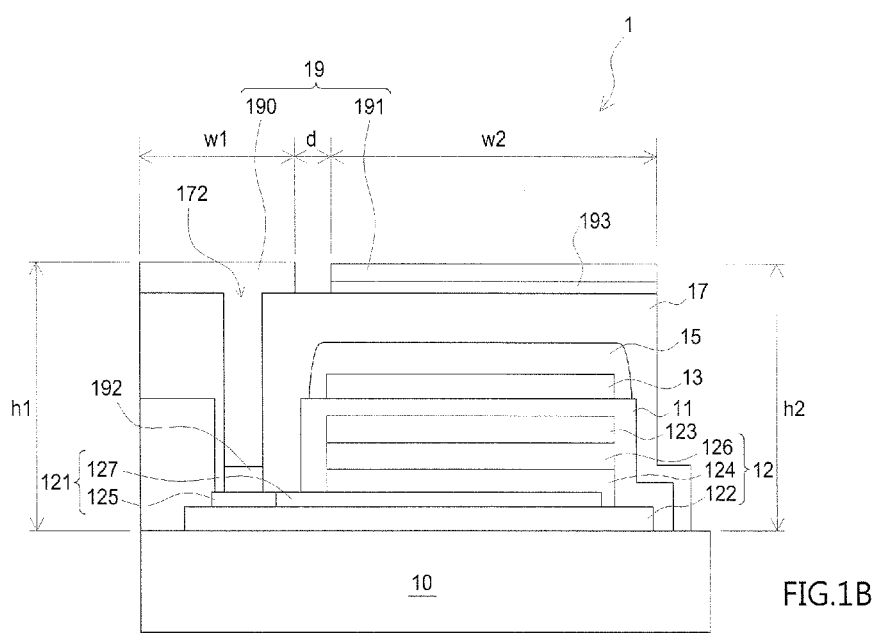
FIG. 1B is a cross-sectional diagram along the line of A-A' in accordance with the light-emitting element of the present application shown in FIG. 1A.

FIG. 1A is a top view of a light-emitting element in accordance with one of the embodiments of the present application. FIG. 1B is a cross-sectional diagram along the line of A-A' of FIG. 1A. As shown in FIGS. 1A and 1B, a light-emitting element 1 comprises a substrate 10; a light-emitting semiconductor stack 12 on the substrate 10; a first protection layer 11 on the light-emitting semiconductor stack 12; a reflective layer 13 on the first protection layer 11; a barrier layer 15 on the reflective layer 13 and covering and surrounding the reflective layer 13; a second protection layer 17 on the barrier layer 15 and covering and surrounding the first protection layer 11, the reflective layer 13, and the barrier layer 15; and a conductive contact layer 19 on the second protection layer 17. The light-emitting semiconductor stack 12 comprises a first semiconductor layer 122 on the substrate 10; a light-emitting layer 124 on the first semiconductor layer 122; a second semiconductor layer 126 on the light-emitting layer 124. The light-emitting element 1 further comprises multiple first electrodes 121 on the first semiconductor layer 122; and a second electrode 123 on the second semiconductor layer 126, wherein each first electrode 121 comprises a contact area 125 and an extension area 127. In the present embodiment, the multiple first electrodes 121 are physically separated from one another, such as spatially separated from one another, and are electrically connected to one another by a first conductive part 190, so as to reduce a portion of the light-emitting semiconductor stack 12 that needs to be removed. Thus, the light emitting area is increased. The second protection layer 17 has a first through hole 172 and a second through hole 174, wherein the first through hole 172 is above the contact area 125, as shown in FIG. 1B, and the second through hole 174 is above the barrier layer 15, as shown in FIG. 1A.

The conductive contact layer 19 is for receiving an external voltage and for heat dissipation. The conductive contact layer 19 comprises a first conductive part 190 and a second conductive part 191, and the conductive contact layer 19 is composed of one or multiple metal materials. The metal material comprises Cu, Sn, Au, Ni, Ti, Pt, Pb, AuSn alloy, Cu-Sn, Cu-Zn, Cu-Cd, Sn-Pb-Sb, Sn-Pb-Zn, Ni-Sn, Ni-Co, Au alloy, Au-Cu-Ni-Au, and the combinations thereof.

Referring to FIG. 1A, each extension area 127 of the first electrodes 121 extends outwardly from one of the contact areas 125 so the extension areas 127 cover larger area on the first semiconductor layer 122 to improve current spreading. As shown in FIG. 1A, an end of each extension area 127 distant away from the contact areas 125 is under the second conductive part 191, but the present disclosure is not limited to this, and the end of each extension area 127 can also protrude beyond a projected area of the second conductive part 191. Referring to FIG. 1B, the first conductive part 190 is electrically connected to the contact areas 125 of the first electrodes 121 by the first through hole 172, and therefore a current can flow from the first conductive part 190 to the first semiconductor layer 122 through the first electrodes 121, wherein the first semiconductor layer 122 is under the second conductive part 191. The second conductive part 191 is electrically connected to the barrier layer 15 by the second through hole 174, and therefore a current can flow from the second conductive part 191 to the second semiconductor layer 126 through the barrier layer 15, the reflective layer 13, and the second electrode 123. Referring to FIG. 1B, the first conductive part 190 comprises a first width w1 and the second conductive part 191 comprises a second width w2. In the present embodiment, the first width w1 is smaller than the second width w2. A distance d between the first conductive part 190 and the second conductive part 191 is at least about 50 μm. More preferably, the distance d ranges from 70 to 150 μm. A distance smaller than 50 μm leads to a short circuit, for example, prior to a process of soldering the light-emitting element 1 and a base (not shown), a solder paste is applied on the first conductive part 190 and the second conductive part 191 respectively, if the distance d is smaller than 50 μm, the solder pastes on the first conductive part 190 and the second conductive part 191 are easily in contact with each other, and the contact then causes a short circuit; or during a process of an eutectic bonding between the light-emitting element 1 and a base, an inaccurate alignment between the light-emitting element 1 and the base leads to a misalignment between the first conductive part 190 and one of the electrodes on the base, and between the second conductive part 191 and another electrode of the base, and then the misalignment causes a short circuit.

In another embodiment, the first conductive part 190 comprises a first height h1 defined as a distance between an upper surface of the first conductive part 190 and an upper surface of the substrate 10, and the second conductive part 191 comprises a second height h2 defined as a distance between an upper surface of the second conductive part 191 and the upper surface of the substrate 10, wherein the first height h1 is substantially equal to the second height h2. As a result, a height difference between the first conductive part 190 and the second conductive part 191, which causes a failure of a connection between a base and the light-emitting element 1, is prevented. Thus, the quality is improved. The first width w1 of the present embodiment is not limited to smaller than the second width w2. The first width w1 can be larger than or equal to the second width w2 as well.

In another embodiment, referring to FIG. 1B, the first conductive part 190 comprises a first height balancer 192 filled in the first through hole 172, preferably on the second protection layer 17, and the second conductive part 191 comprises a second height balancer 193 on the second protection layer 17. The first height balancer 192 and the second height balancer 193 can be used for adjusting the height of the first conductive part 190 and the height of the second conductive part 191 respectively, such as used for rendering the height of the first conductive part 190 substantially equal to the height of the second conductive part 191, that is, rendering the first height h1 substantially equal to the second height h2.

In another embodiment, the first height balancer 192 of the first conductive part 190 renders the first height h1 larger than the second height h2. In the case of soldering process, during the process of soldering the light-emitting element 1 and a base, when the surface area of the upper surface of the second conductive part 191 is larger than the surface area of the upper surface of the first conductive part 190, the adhesion of second conductive part 191 to the base is stronger than the adhesion of the first conductive part 190 to the base since a contact area between the second conductive part 191 and the solder paste is larger. The adhesion difference causes the substrate 10 to warp during the heating process and thus results in a height difference, which further causes the first conductive part 190 to peel from the base. As a result, when the first height h1 is larger than the second height h2, the first height h1 can reduce the height difference caused by the warp of the substrate 10, and thus prevent the first conductive part 190 from peeling from the base. Besides, the height difference between the first height h1 and the second height h2 can also alleviate a problem of a height difference of the electrodes on the base or a misalignment of the electrodes, and thus further mitigate a problem of the first conductive part 190 peeling from the base, wherein the height difference of the electrodes is caused by the warp of the substrate 10, the design of the base or the unevenness of the surface, and the misalignment of the electrodes is resulted from a factor related to the manufacturing process, such as vibration or gas flow. Specifically, the first height h1 is about 1 to 10 μm larger than the second height h2.

The substrate 10 is used for supporting the light-emitting semiconductor stack 12 and other layers or structures thereon. The material of the substrate 10 can be transparent material comprising sapphire, diamond, glass, epoxy, quartz, acrylics, $Al_2O_3$, GaAs, ZnO or AlN, wherein sapphire and GaAs can be used for growing a light-emitting semiconductor stack.

The light-emitting semiconductor stack 12 can be directly grown on the substrate 10, or can be fixed on the substrate 10 by a bonding layer (not shown). The material of the light-emitting semiconductor stack 12 can be semiconductor material comprising one or more elements selected from the group consisting of Ga, Al, In, P, N, Zn, Cd, and Se. The electrical polarity of the first semiconductor layer 122 is different from that of the second semiconductor layer 126. The light-emitting layer 124 emits light having one or more colors and the structure of light-emitting layer 124 can be single heterostructure (SH), double heterostructure (DH), double-side double heterostructure (DDH), multi-quantum well (MQW) or quantum dots.

The first electrodes 121 and the second electrode 123 are used for conducting a current, and the material of the first electrodes 121 and the second electrode 123 is transparent material or metal material, wherein the transparent material comprises indium tin oxide (ITO), indium oxide (InO), tin oxide (SnO), cadmium tin oxide (CTO), antimony tin oxide (ATO), aluminium zinc oxide (AZO), zinc tin oxide (ZTO), zinc oxide (ZnO), gallium doped zinc oxide(GZO), indium zinc oxide (IZO), AlGaAs, GaN, GaP, GaAs, GaAsP, or diamond-like carbon (DLC), and the metal material includes Cu, Sn, Au, Ni, Pt, Al, Ti, Cr, Pb, Cu-Sn, Cu-Zn, Cu-Cd, Sn-Pb-Sb, Sn-Pb-Zn, Ni-Sn, Ni-Co, Au alloy, Au-Cu-Ni-Au or combinations thereof.

The first protection layer 11 and/or the second protection layer 17 are used for electrically insulating the first conductive part 190 and the second conductive part 191 from the reflective layer 13, and for preventing the reflective layer 13 from a damage caused by the first conductive part 190 and the second conductive part 191. The first protection layer 11 and/or the second protection layer 17 are used for securing the reflective layer 13 and improving the mechanical strength of the light-emitting element 1. The material of the first protection layer 11 and the second protection layer 17 can be an insulating material comprising polyimide (PI), benzocyclobutene (BCB), prefluorocyclobutane (PFCB), MgO, epoxy, Sub, acrylic resin, cyclic olefin polymers (COC), polymethylmethacrylate (PMMA), polyethylene terephthalate (PET), polycarbonate (PC), polyetherimide, fluorocarbon polymer, glass, $Al_2O_3$, $SiO_x$, $TiO_2$, $SiN_x$ or spin-on glass.

The reflective layer 13 reflects the light emitted from the light-emitting semiconductor stack 12. The material of the reflective layer 13 comprises Cu, Al, Sn, Au, Ag, Ti, Ni, Pt, TiW alloy, Ag-Ti, Ni-Sn, Au alloy, Ni-Ag or Ti-Al.

The barrier layer 15 is used for avoiding an ionic diffusion from the reflective layer 13 and/or for enhancing the adhesion between the reflective layer 13 and the second protection layer 17. The material of the barrier layer 15 comprises Cu, Al, Sn, Au, Ag, Ti, Ni, Pt, TiW alloy, Ag-Ti alloy, Ni-Cr, Ag-Ti, Ni-Sn, Au alloy, Ni-Ag, or Ti-Al.

Figure 1C:
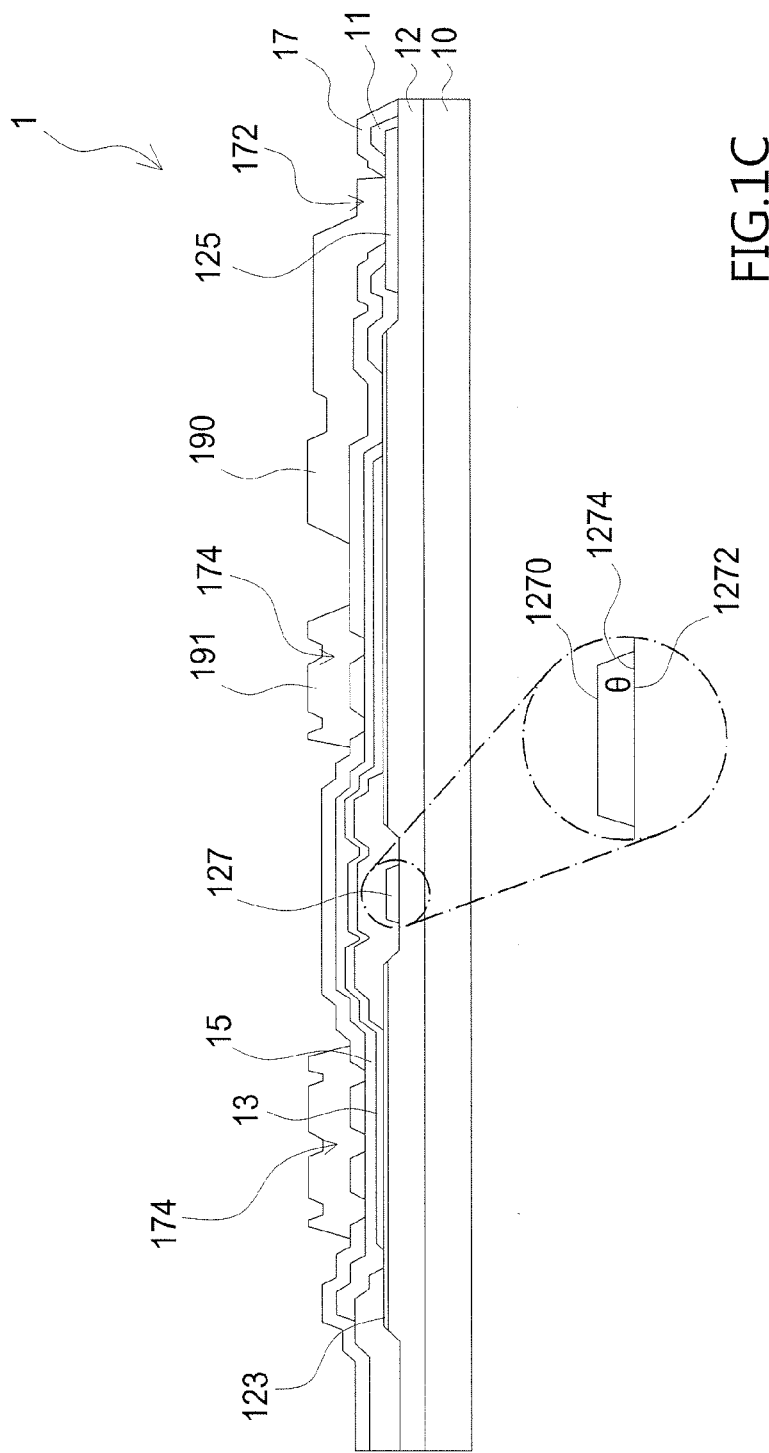
FIG. 1C is a cross-sectional diagram along the line of B'-B' shown in FIG. 1A in accordance with one of the embodiments of the light-emitting element of the present application.
Figure 1D:
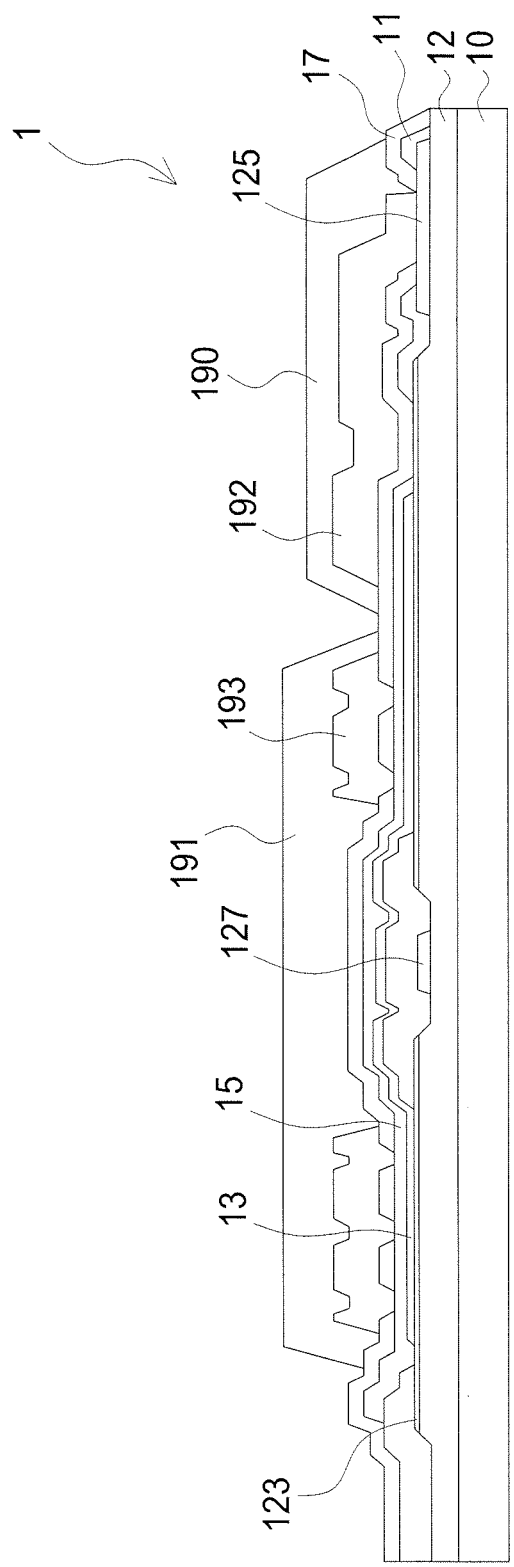
FIG. 1D is a cross-sectional diagram along the line of B'-B' shown in FIG. 1A in accordance with one of the embodiments of the light-emitting element of the present application.

FIG. 1C is a cross-sectional diagram along the line of B'-B' shown in FIG. 1A in accordance with another embodiment. Referring to FIG. 1C, the laminated layer structures above the substrate 10 of the light-emitting element 1 can comprise similar profiles, for example, each comprises aside face inclined relative to the substrate 10. Specifically, as shown in FIG. 1C, the extension area 127 comprises an upper face 1270, a lower face 1272 opposite to the upper face 1270, a side face 1274 between the upper face 1270 and the lower face 1272, and an angle Θ between the side face 1274 and the lower face 1272, wherein the angle Θ ranges from about 15 degrees to 70 degrees, more preferably, from about 30 degrees to 45 degrees. Compared with an extension area comprising an angle of 90 degrees between the side face and the lower face, the angle Θ of the extension area 127 causes the side face 1274 to have a more gentle slope, and therefore the structures formed on the extension area 127 such as the first protection layer 11, do not have deficiency in structure such as insufficient of thickness, which is resulted from a steep side face, and the deficiency may further result in instability and a lowering yield of a optoelectronic device. Accordingly, the stability of the light-emitting element 1 is improved. The first conductive part 190 and the second conductive part 191 can each have a concave-convex profile. In another embodiment, as shown in FIG. 1D, each upper face of the first conductive part 190 and the second conductive part 191 is flat since the first conductive part 190 and the second conductive part 191 have the first height balancer 192 on the second protection layer 17 and the second height balancer 193 on the second protection layer 17 respectively. Specifically, the first height balancer 192 is in the first through hole 172 and on part of the second protection layer 17. The second height balancer 193 is on part of the second protection layer 17 and filled in the second through hole 174.

Figure 1E:
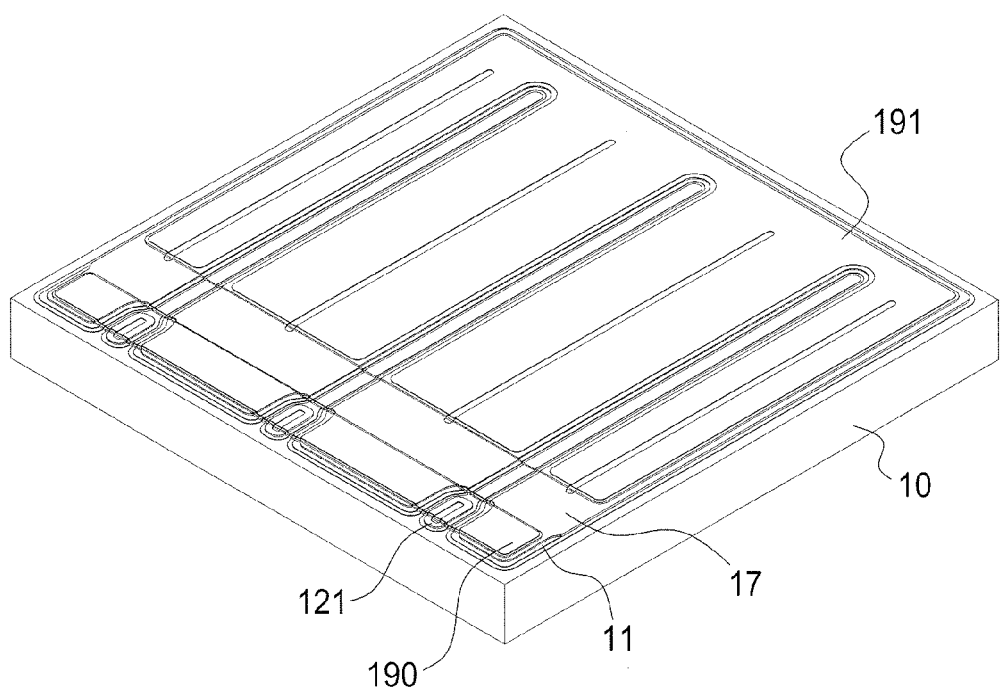
FIG. 1E is a three dimensional view in accordance with the light-emitting element of the present application shown in FIG. 1A.

FIG. 1E is a three dimensional view in accordance with the light-emitting element 1 of the present application shown in FIG. 1A. As shown in FIG. 1E, the second protection layer 17 is on the substrate 10, and the first conductive part 190 and the second conductive part 191 are on the second protection layer 17.

Figure 2A:
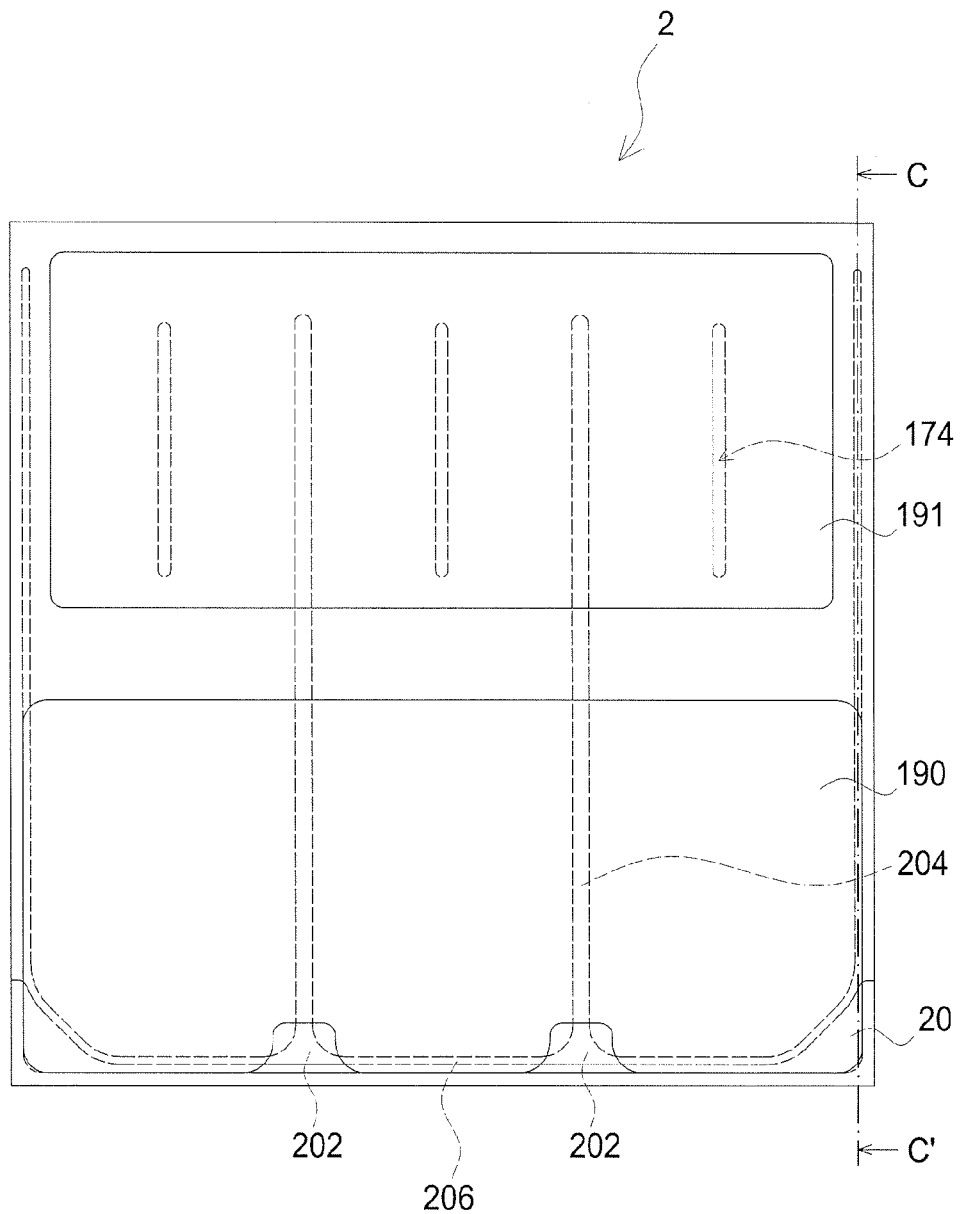
FIG. 2A is a top view of a light-emitting element in accordance with one of the embodiments of the present application.
Figure 2B:
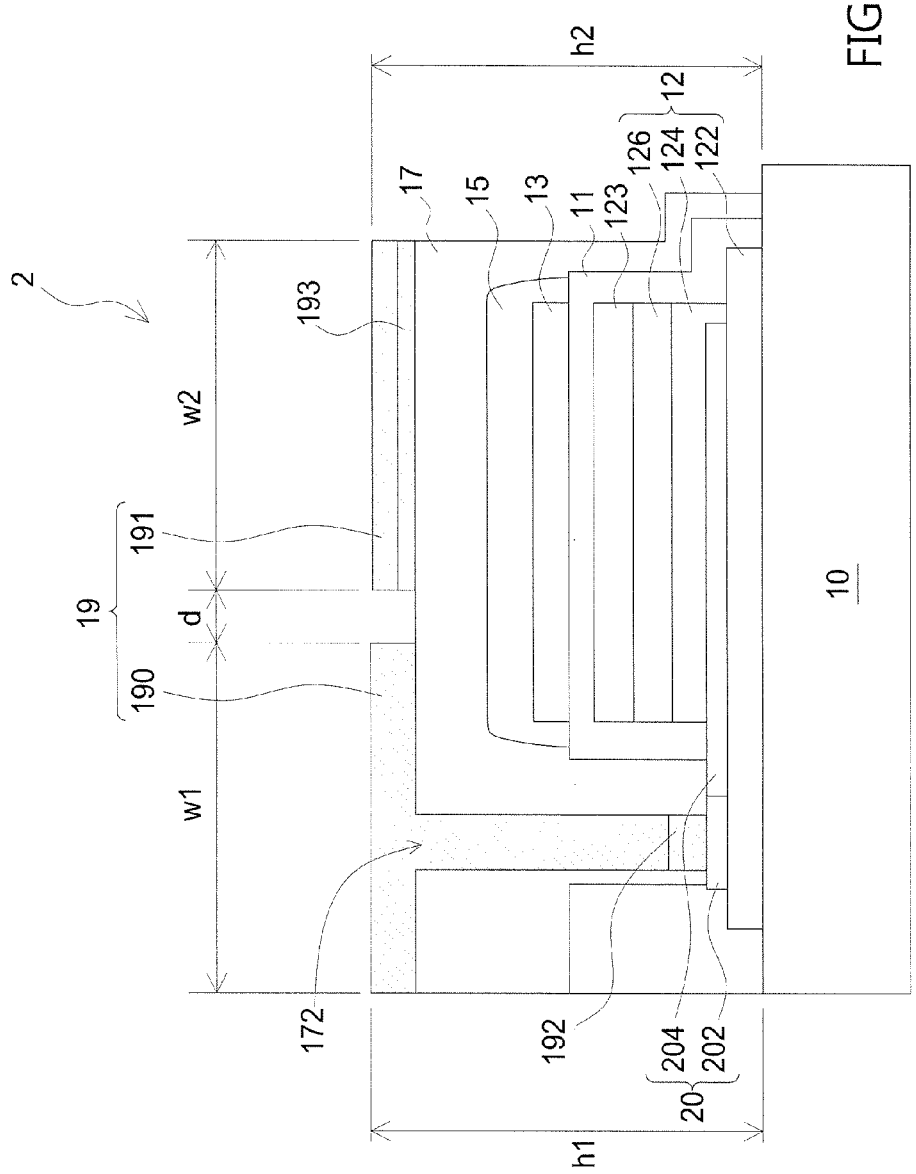
FIG. 2B is a cross-sectional diagram along the line of C-C' in accordance with the light-emitting element of the present application shown in FIG. 2A.

FIG. 2A is a top view of a light-emitting element 2 in accordance with another embodiment of the present application, and FIG. 2B is a cross-sectional diagram along the line of C-C' in accordance with the light-emitting element 2 of the present application shown in FIG. 2A. As shown in FIG. 2A, the first electrode 20 of the light-emitting element 2 has multiple contact areas 202, multiple extension areas 204 and a connecting area 206 connecting the multiple contact areas 202. The first conductive part 190 is electrically connected to the contact areas 202 of the first electrode 20 by the first through hole 172, and therefore a current can flow from the first conductive part 190 to the first semiconductor layer 122 through the first electrode 20, wherein the first semiconductor layer 122 is under the second conductive part 191. Besides, the second protection layer 17 electrically insulates the first conductive part 190 from the second semiconductor layer 126. In the present embodiment, the surface area of the upper surface of the first conductive part 190 can be substantially equal to the surface area of the upper surface of the second conductive part 191. As a result, during a process of soldering the light-emitting element 2 and a base, a peeling problem of the first conductive part 190 or the second conductive part 191 from the base caused by the adhesion difference to the base is avoided, wherein the adhesion difference is caused by the difference in surface area of the upper surface of the first conductive part 190 and the upper surface of the second conductive part 191. Accordingly, the quality of the soldering process is improved. More preferably, when the surface area of the upper surface of the first conductive part 190 is substantially equal to the surface area of the upper surface of the second conductive part 191, the height of the first conductive part 190 is substantially equal to the height of the second conductive part 191, that is, the first height h1 is substantially equal to the second height h2.

In another embodiment, a ratio of the surface area of the upper surface of the first conductive part 190 to the surface area of the upper surface of the second conductive part 191 ranges from about 0.8 to 1.2, more preferably, from about 0.9 to 1.1. In another embodiment, as shown in FIG. 2B, a first width w1 of the first conductive part 190 is substantially equal to a second width w2 of the second conductive part 191. In another embodiment, a ratio of the first width w1 to the second width w2 ranges from about 0.8 to 1.2, more preferably, from about 0.9 to 1.1.

Referring to FIG. 2A, the first conductive part 190 does not cover a part of each contact area 202, so the part of each contact area 202 and/or the second protection layer 17 on the part of each contact area 202 are exposed. Prior to a process of eutectic bonding between the first conductive part 190 and a base, a solder flux is applied on the surface of the first conductive part 190. After the eutectic bonding, the solder flux residue needs to be cleaned so as to prevent the following packaging process being affected by the solder flux residue. In the present embodiment, the exposed second protection layer 17 is near the edge of the light-emitting element 2, and thus a solder flux residue remained between the light-emitting element 2 and the base is easy to clean through the exposed second protection layer 17. Accordingly, the quality of the following packaging process is improved.

Figure 3:
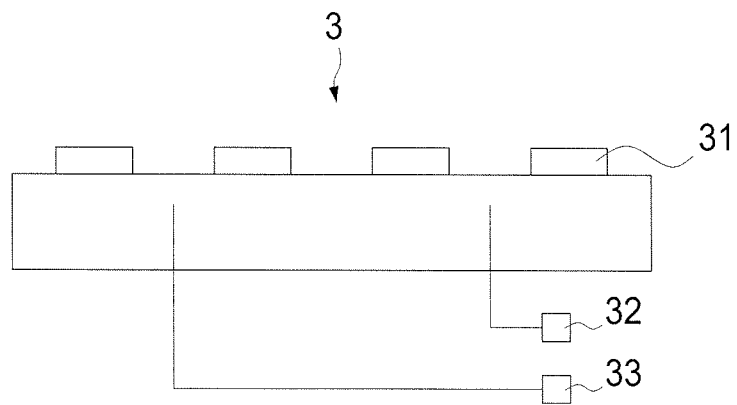
FIG. 3 schematically shows a light-generating element in accordance with one of the embodiments of the present application.

FIG. 3 schematically shows a light-generating element 3 of an embodiment of the present application. The light-generating element 3 comprises a light-emitting element of any one of the embodiments as mentioned above. The light-generating element 3 can be a lighting device, such as a street light, a headlight, or an interior lighting, or can be a traffic light or a backlight of a backlight module of a flat panel display. The light-generating element 3 comprises a light source 31 comprising a light-emitting element of any embodiment as mentioned above, a power supply system 32 used for providing a current to the light source 31, and a control element used for controlling the power supply system 32.

Figure 4:
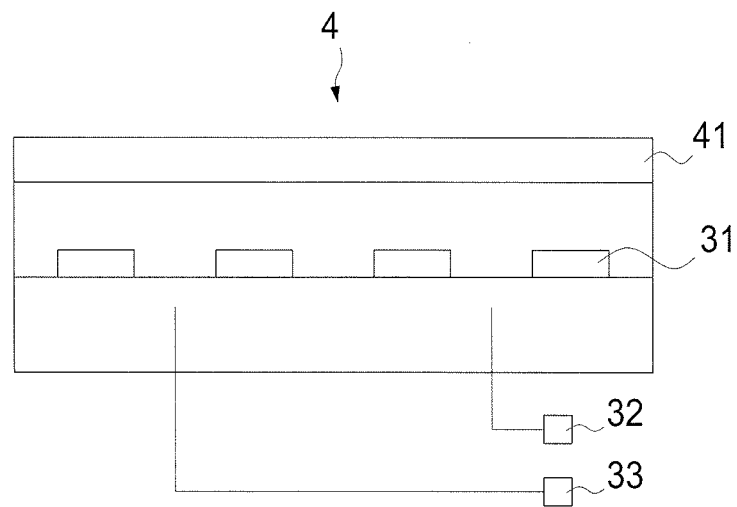
FIG. 4 schematically shows a backlight module in accordance with one of the embodiments of the present application.

FIG. 4 schematically shows a backlight module 4 of an embodiment of the present application. The backlight module 4 comprises a light-generating element 3 as mentioned above and an optical element 41. The optical element 41 processes the light generated by the light-generating element 3, such as diffuses the light generated by the light-generating device 3. The backlight module 4 is applicable to flat panel displays.

Figure 5:
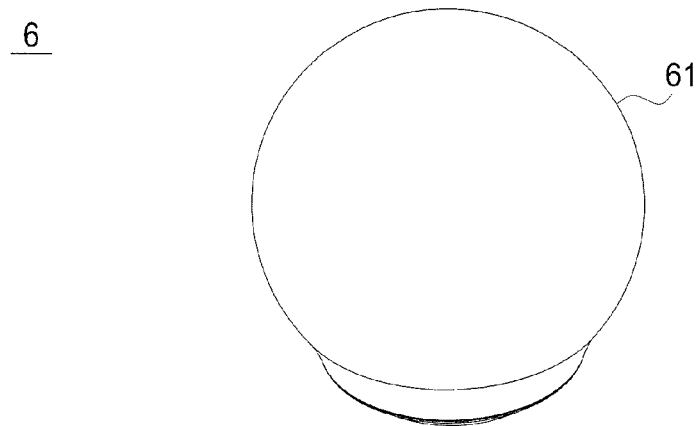
FIG. 5 is an exploded view of a light bulb in accordance with one of the embodiments of the present application.
Figure 5:
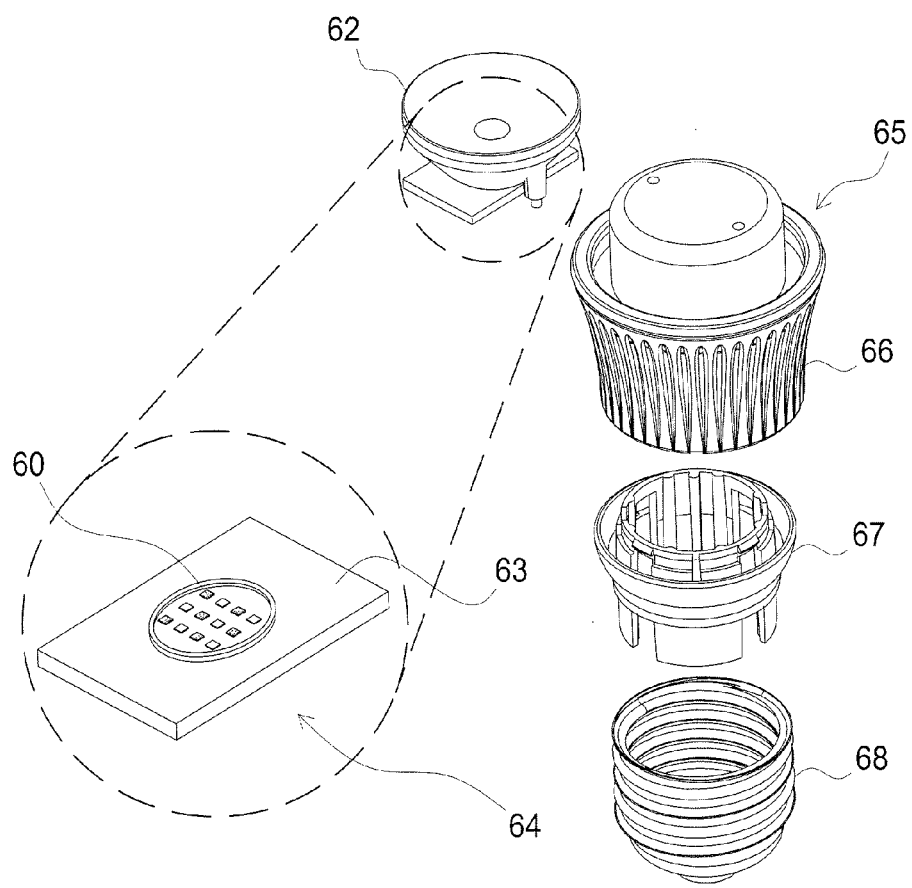
Figure 6:
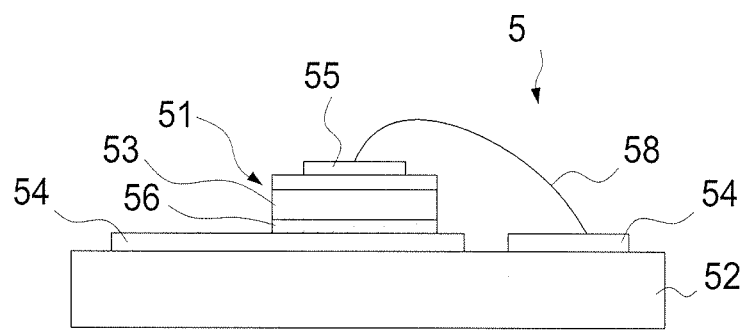
FIG. 6 schematically shows a conventional light-emitting device.

FIG. 5 is an exploded view of a light bulb 6 in accordance with one of the embodiments of the present application. The light bulb 6 comprises a lamp 61, a lens 62 disposed in the lamp 61, a lighting module 64 disposed under the lens 62, a lamp holder 65 comprising a heat sink 66, wherein the lighting module 64 is used for holding the lighting module 64, a connecting part 67, and an electrical connector 68, wherein the connecting part 67 connects the lamp holder 65 to the electrical connector 68. The lighting module 64 comprises a carrier 63 and multiple light-emitting elements 60 of any one of the embodiments as mentioned above, wherein the multiple light-emitting elements 60 are on the carrier 63.

The foregoing description of preferred and other embodiments in the present disclosure is not intended to limit or restrict the scope or applicability of the inventive concepts conceived by the Applicant. In exchange for disclosing the inventive concepts contained herein, the Applicant desires all patent rights afforded by the appended claims. Therefore, it is intended that the appended claims include all modifications and alterations to the full extent that they come within the scope of the following claims or the equivalents thereof.

What is claimed is:

1. A light-emitting element, comprising:
    a light-emitting semiconductor stack comprising:
        a first semiconductor layer;
        a second semiconductor layer on the first semiconductor layer; and
        a light-emitting layer between the first semiconductor layer and the second semiconductor layer;
    a first electrode comprising an contact area and an extension electrically connected to the first semiconductor layer, wherein the extension is connected to the contact area;
    a second electrode on the second semiconductor layer; and
    a first conductive part and a second conductive part formed on the light-emitting semiconductor stack and respectively electrically connected to the first electrode and the second electrode, wherein the extension is formed beyond a projected area of the second conductive part and not covered by the first conductive part, and the contact area is covered by the first conductive part.

2. The light-emitting element according to claim 1, further comprising a reflective layer on the second electrode; and a barrier layer on the reflective layer.

3. The light-emitting element according to claim 2, further comprising a first protection layer on the light-emitting semiconductor stack, a second protection layer comprising a first through hole on the contact area of the first electrode and a second through hole on the barrier layer.

4. The light-emitting element according to claim 3, wherein the first conductive part is formed in the first through hole and extended onto a surface of the second protection layer, and the second conductive part is formed in the second through hole and extended onto another surface of the second protection layer.

5. The light-emitting element according to claim 3, wherein the extension of the first electrode is covered by the second protection layer.

6. The light-emitting element according to claim 3, wherein part of the barrier is between the first protection layer and the second protection layer.

7. The light-emitting element according to claim 1, wherein an end of the extension is formed beyond the projected area of the second conductive part and not covered by the first conductive part.

8. The light-emitting element according to claim 1, wherein the second electrode comprises transparent conductive material.

9. The light-emitting element according to claim 2, wherein the reflective layer and the barrier layer comprises metal material.

10. The light-emitting element according to claim 2, wherein the reflective layer is formed between the barrier layer and the second electrode.

11. A light-emitting element, comprising:
    a light-emitting semiconductor stack comprising:
        a first semiconductor layer;
        a second semiconductor layer on the first semiconductor layer; and
        a light-emitting layer between the first semiconductor layer and the second semiconductor layer;

a first electrode comprising multiple contact areas and multiple extension areas, wherein the multiple contact areas are physically separated from one another; and a first conductive part and a second conductive part are formed on the light-emitting semiconductor stack and respectively electrically connected to the first semiconductor layer and the second semiconductor layer, wherein the multiple extensions are formed beyond a projected area of the second conductive part and not covered by the first conductive part, and the multiple contact areas are covered by the first conductive part.

12. The light-emitting element according to claim 11, wherein the first conductive part and the second conductive part comprise a distance there between, and the distance is at least 50 μm.

13. The light-emitting element according to claim 11, further comprising a second electrode on the second semiconductor layer; a reflective layer on the second electrode; and a barrier layer on the reflective layer.

14. The light-emitting element according to claim 13, further comprising a first protection layer on the light-emitting semiconductor stack, a second protection layer comprising a first through hole on one of the multiple contact areas of the first electrode and a second through hole on the barrier layer.

15. The light-emitting element according to claim 14, wherein the first conductive part is formed in the first through hole and extended onto a top surface of the second protection layer and the second conductive part is formed in the second through hole and extended onto the top surface of the second protection layer.

16. The light-emitting element according to claim 14, wherein the multiple extensions of the first electrode are covered by the second protection layer.

17. The light-emitting element according to claim 14, wherein part of the barrier is between the first protection layer and the second protection layer.

18. The light-emitting element according to claim 11, wherein an end of each of the multiple extensions is formed beyond the projected area of the second conductive part and not covered by the first conductive part.

19. The light-emitting element according to claim 13, wherein the second electrode comprises transparent conductive material.

20. The light-emitting element according to claim 13, wherein the reflective layer and the barrier layer comprises metal material.

* * * * *